INVENTOR
Gene Strull
BY
Frederick Shapoe
ATTORNEY

Jan. 12, 1965 G. STRULL 3,165,710

SOLID STATE OSCILLATOR

Filed March 27, 1961 3 Sheets-Sheet 3

United States Patent Office 3,165,710
Patented Jan. 12, 1965

3,165,710
SOLID STATE OSCILLATOR

Gene Strull, Pikesville, Md., assignor to Westinghouse Electric Corporation, East Pittsburgh, Pa., a corporation of Pennsylvania Filed Mar. 27, 1961, Ser. No. 98,468
16 Claims. (Cl. 332—17)

This invention relates generally to a semiconductor device and more specifically to a multi-region, two terminal semiconductor device which functions as a modulated oscillator.

An object of the present invention is to provide an oscillatory semiconductor device whose oscillaton may be modulated by the application of an external electrical signal thereto.

Another object of the present invention is to provide an oscillatory semiconductor device comprised of six functional regions of alternate n- and p-type semiconductivity with p-n junctions therebetween, means for applying a voltage across the device, whereby oscillation is initiated, and means for modulating such oscillation by the application of an electrical signal across one of the junctions between regions within the device.

Still another object of the present invention is to provide a modulated oscillator comprising a semiconductor device, said device comprising a semiconductor structure having four functional regions of alternate n- and p-type semiconductivity with p-n junctions therebetween, and a semiconductor structure having three functional regions of alternate n- and p-type semiconductivity with p-n junctions therebetween, said four functional region structure and said three functional region structure being connected electrically in a series circuit relationship through a common region, means for connecting the semiconductor device in a series relationship with a direct current power source, whereby said semiconductor device will oscillate, and means for modulating said oscillation by applying an electrical signal across a p-n junction within the semiconductor device.

Other objects of the invention will, in part, be obvious and will, in part, appear hereinafter.

For a better understanding of the nature and objects of the invention, reference should be had to the following detailed description and drawings, in which.

In accordance with the present invention and attainment of the foregoing objects, there is provided an oscillatory semiconductor device comprising a unitary body of a semiconductor material having at least six semiconductive regions correlated to provide six functional regions of alternate n- and p-type semiconductivity with p-n junctions therebetween, means for applying a voltage across the device, whereby oscillation is initiated, and means for modulating such oscillation by the application of a signal across one of the junctions between the regions within the device.

Figure 1:
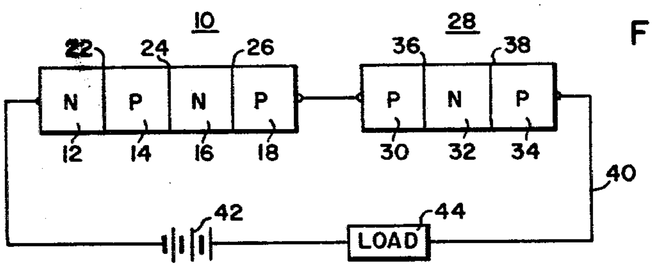
FIGURE 1 is a schematic circuit diagram showing a four region two terminal semiconductor device connected electrically in series with a two terminal three region semiconductor device, a power source and a load.

With reference to FIGURE 1, when a two terminal four region, negative resistance semiconductor structure 10, having alternate regions of n- and p-type semiconductivity, 12, 14, 16 and 18, respectively, with p-n junctions 22, 24 and 26 respectively therebetween is connected electrically in a series relationship with a two terminal three region semiconductor structure 28, having alternate regions of p- and n-type semiconductivity 30, 32 and 34 respectively, with p-n junctions 36 and 38 therebetween, and the two semiconductor structures 10 and 28 are connected electrically in a series relationship by a conductor 40 with a direct current power source 42 and, if desired, a load 44, oscillation will result if the I-V characteristics of the two semiconductor structures 10 and 28 are correlated in a certain relationship.

The load 44 is not necessary for oscillation, since oscillation will occur without the load 44 being connected in the circuit. However, for most practical applications of the device of this invention a load will be included in the circuit. The load 44, if used, may be an oscilloscope, an antenna, an amplifier or the like.

The two terminal four region structure 10 is functionally the equivalent of two transistors connected in tandem. Functionally, region 12 is an emitter, region 14 a base and region 16 a collector of the first transistor. Functionally, region 18 is an emitter, region 16 a base, and region 14 a collector of the second transistor. It will be noted that regions 14 and 16 are common to both transistors.

The two terminal three region structure 28 is essentially a transistor with only two terminals connected. Functionally region 34 is the emitter, region 32 the base and region 30 the collector.

Figure 2:
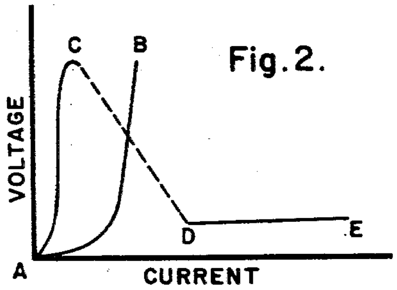
FIGURE 2 is a graph setting forth the first quadrant I-V characteristic of a semiconductor device suitable for use in accordance with the teachings of this invention.

With reference to FIGURE 2, the necessary relationship for oscillation will exist if the materials, areas of the regions and the electrical resistivities of the two semiconductor structures are so correlated that the I–V characteristics (voltage-current collector characteristic designated as line AB in FIGURE 2) of the three region, two terminal structure falls entirely within the first quadrant negative resistance area of the two terminal, four region semiconductor structure characteristic. The first quadrant negative resistance area of the semiconductor structure 10 is the area between the breakover voltage line AC and the sustaining current line DE.

Figure 3:
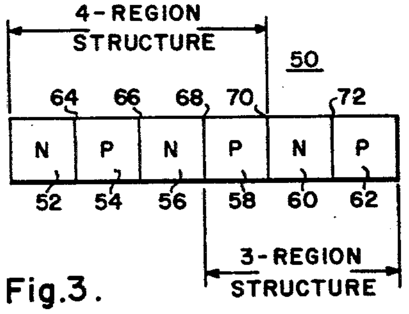
FIGURE 3 is a schematic diagram of a six functional region semiconductor device.

Wtih reference to FIGURE 3, the two semiconductor structures 10 and 28 may be combined into one unitary semiconductor device 50. The semiconductor device 50 is a six functional region device and is the functional equivalent of the two semiconductor structures 10 and 28. The device 50 is comprised of alternate n- and p-type regions 52, 54, 56, 58, 60 and 62 respectively, with p-n junctions 64, 66, 68, 70 and 72 respectively therebetween.

Regions 52, 54, 56 and 58 of the semiconductor device 50 comprises the functional equivalent of regions 12, 14, 16 and 18 respectively of the semiconductor structure 10. Regions 58, 60 and 62 of the semiconductor device 50 comprise the functional equivalent of regions 30, 32 and 34 respectively of the semiconductor structure 28. It will be noted that region 58 is common to both segments of the device 50. Region 58 of the semiconductor device 50 is functionally the equivalent of region 18 of the structure 10, which is one of the emitter regions, and is functionally equivalent to region 30 of structure 28 which is the collector region thereof.

Figure 4:
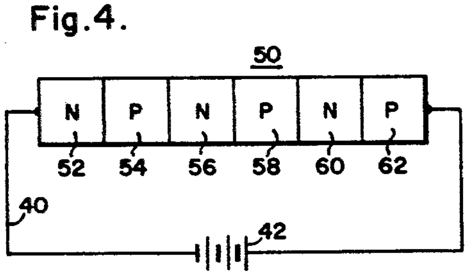
FIGURE 4 is a schematic circuit diagram of the six functional region semiconductor device of FIGURE 3 connected in a series circuit relationship with a power source.

With reference to FIGURE 4, when the semiconductor device 50 is connected electrically in a series relationship with the power source 42 by the conductor 40, oscillation will result if the first quadrant collector current-voltage characteristic of the segment of the device 50 comprised of regions 58, 60 and 62 falls within the negative resistance area of the first quadrant characteristic of the segment of the device 50 comprised of regions 52, 54, 56 and 58. That is, when the first quadrant collector voltage-current characteristic of the three region structure segment falls within the first quadrant negative resistance area of the four region structure segment.

In the circuit of FIGURE 4, a load, such as an oscilloscope, amplifier, antenna or the like may be connected in the circuit in a series relationship through a conductor 40 with the semiconductor device 50 and the direct current power source 42, but such a load is not necessary for oscillation.

An oscillator such as the type illustrated in FIGURE 4 will generally oscillate at a substantially constant amplitude and frequency. There may however be some uncontrollable minor changes in amplitude and frequency due to changes in operating conditions such as voltage variation and the temperature changes.

The discovery has now been made that the amplitude, or the frequency, of both the amplitude and frequency may be controllably modulated by the application of an electrical signal to particular regions and across the p-n junctions therebetween of the oscillating semiconductor device.

Figure 5:
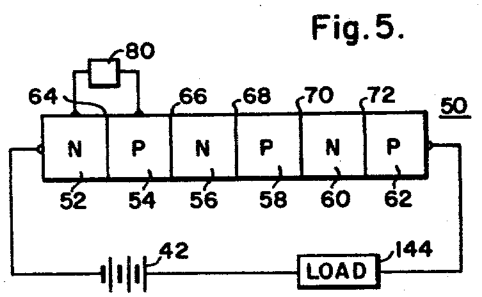
FIGURE 5 is a schematic circuit diagram of the six functional region semiconductor device of FIGURE 3.

With reference to FIGURE 5, there is illustrated the semiconductor device 50 connected electrically in a series circuit relationship with the direct current power source 42 and an oscilloscope 144. The direct current power source 42 is connected entirely across the device 50; through regions 52 and 62, and consequently the semiconductor device 50 oscillates. The waves of oscillation have a first amplitude and a first frequency.

To modulate the amplitude of the oscillation wave, an electrical signal from the source 80 is applied to regions 52 and 54, hereinafter referred to as the first two regions of the four region structure, and across p-n junction 64. As the electrical signal is varied in intensity or magnitude, the amplitude of the oscillation wave is changed. In some cases, the wave form will be modified from a saw-tooth type of wave to a sinusoidal type wave.

Figure 6:
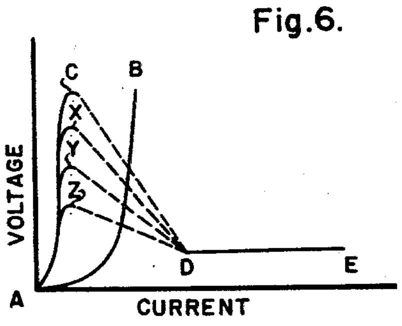
FIGURE 6 is a modified plot of the I–V first quadrant characteristic of a semiconductor device used in accordance with the teachings of this invention.

With reference to FIGURE 6, the amplitude of the wave of oscillation is controlled by the breakover voltage characteristic, line AC, of the four region segment of the device 50. As the magnitude of the electrical signal is increased, the breakover voltage line decreases and rather than conforming to line AC conforms to line AX, AY or AZ. A decrease in breakover voltage results in a decrease in the amplitude of the oscillation wave.

If a direct current electrical signal is applied to regions 52 and 54 across p-n junction 64, the decrease in amplitude of the oscillation wave will remain relatively constant. If however an alternating electrical current signal is applied to regions 52 and 54 across p-n junction 64, the amplitude modulation will vary with the magnitude of the electrical signal.

The magnitude of the electrical signal used will depend upon the magnitude of the breakover voltage and the modulation desired. It is imperative, of course, that the I–V characteristic of the three region structure maintain its position entirely within the negative resistance area of the four region structure during modulation.

Figure 7:
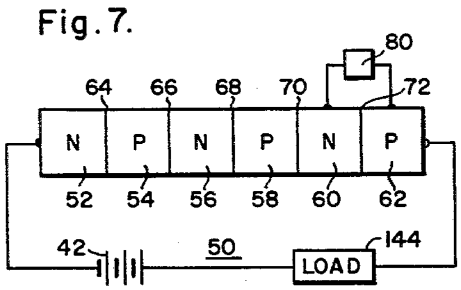
FIGURE 7 is a schematic circuit diagram of the semiconductor device of FIGURE 3 used in accordance with the teachings of this invention.
Figure 8:
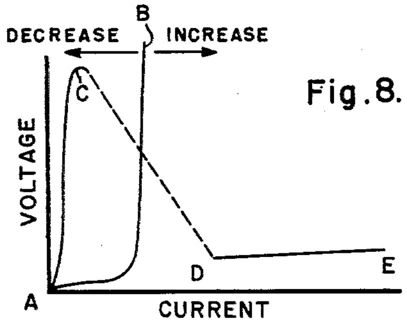
FIGURE 8 is a graph setting forth the I–V first quadrant characteristics of a semiconductor device being employed in accordance with the teachings of this invention.

With reference to FIGURE 7, if an electrical signal is applied between regions 60 and 62 across p-n junction 72, the frequency of oscillation will be modulated. With reference to FIG. 8, the application of the electrical signal will cause the I–V characteristic line AB to move either toward the sustained current line DE, with a resulting increase in the frequency of oscillation or toward the breakover voltage line AC with a resulting decrease in the frequency of oscillation. The magnitude of the signal will of course depend upon the original position of the I–V characteristic line of the three region structure within the negative resistance area of the I–V characteristic of the four region structure, it being necessary that the three region I–V characteristic be maintained within the negative resistance area of the four region structure at all times.

If a direct current signal is applied, the degree of frequency modulation will remain essentially constant. If an alternating current signal is used, the degree of modulation will vary with the changing intensity of the signal.

Figure 9:
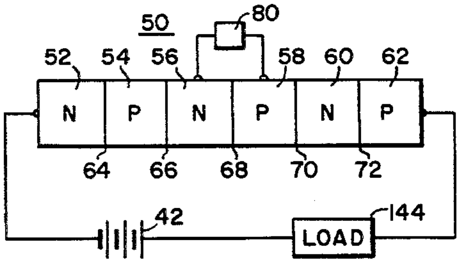
FIGURE 9 is a modified schematic circuit diagram of the semiconductor device of FIGURE 3.
Figure 10:
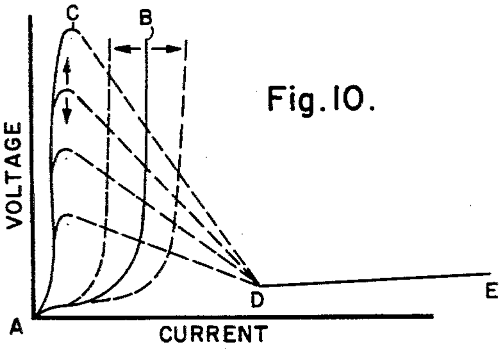
FIGURE 10 is a schematic diagram of a semiconductor device which functions in the same manner as the device set forth in FIGURE 3 but is of different geometric configuration.

With reference to FIGURE 9, the modulation of both the amplitude and the frequency at the same time and by the same signal can be accomplished by the application of an electrical signal between regions 56 and 58 across p-n junction 68. It will be noted that region 58 is the region common to both the four region structure and the three region structure. Region 56 is the next consecutive region of the four region structure. The means by which the amplitude and the frequency are modulated by electrical signal at the same time is the same as when they are modulated separately. With reference to FIGURE 10, the electrical signal results in a decrease in the breakover voltage (denoted by the line AC) of the four region structure with a resulting decrease or change in the amplitude, and the characteristic of the three region structure (denoted by line AB) is varied either toward the sustaining current line (denoted as line DE) with an increase in frequency or toward the breakover voltage line AC with a decrease in frequency.

As pointed out hereinabove, and as is obvious from FIGURES 3, 4, 5, 7 and 9, the semiconductor device 50 is a six region semiconductor device of an N-P-N-P-N-P configuration. It will of course be understood that the device 50 could also be of a P-N-P-N-P-N configuration.

One skilled in the art will realize the difficulty of attempting to fabricate a six region device of the type illustrated in FIGURES 3, 4, 5, 7 and 9. It is obvious that an attempt to form six alternate p- and n-type regions in a single wafer of a semiconductor material by alloying and/or vapor diffusion would be an almost insurmountable task since: (1) it would be extremely difficult, if not impossible, to control the varying thickness of the regions, especially the interior regions; and (2) great difficulty would be experienced in attempting to make contact to the interior n- and p-type regions.

Figure 11:
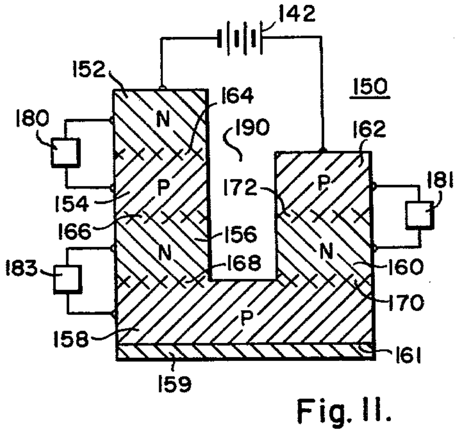
FIGURE 11 is a schematic diagram of a semiconductor device which functions in the same manner as the device set forth in FIGURE 3 but is of different geometric configuration.

With reference to FIGURE 11, there is illustrated a six region semiconductor device 150 which is the functional equivalent of the semiconductor device 50. The semiconductor device 150 is comprised of regions 152, 154, 156, 158, 160 and 162 with p-n junctions 164, 166, 168, 170 and 172 therebetween, which regions and p-n junctions are the functional equivalents of regions 52, 54, 56, 58, 60 and 62 and p-n junctions 64, 66, 68, 70 and 72, respectively of the semiconductor device 50. A layer 159 of an electrically conductive metal is affixed to the bottom surface 161 of region 158. The layer 159 serves to reflect and reinject carriers back into the region 158. The operation of a reflective layer is discussed in detail in U.S. patent application Serial No. 859,191, filed December 14, 1959, the inventor and assignee of which are the same as that of the present invention.

When a direct current voltage from a source 142 is applied across the semiconductor device 150 through regions 152 and 162, the device 150 will oscillate in the same manner as semiconductor device 150 provided of course that the first quadrant I–V collector voltage-current characteristic of the three region structure which is comprised of regions 158, 160 and 162 falls within the first quadrant negative resistance area of the I–V characteristic of the four region structure which is comprised of regions 152, 154, 156 and 158.

An electrical signal, from a source 180, can be applied between regions 152 and 154, the first two regions of the four region structure, and across the p-n junction 164 therebetween, to modulate the amplitude of the wave of oscillation as described hereinabove.

An electrical signal from an electrical source 181 applied between regions 160 and 162, the two independent regions of the three region structure, and across p-n junction 172 therebetween, will modulate the frequency of the oscillation wave in the manner described above.

If the electrical signal from an electrical source 183 is applied between regious 158 and 156, the region common to both structures and the next consecutive regior of the four region structure, respectively, and across the p-n junction 168 therebetween, both the amplitude and frequency of the oscillation wave can be modulated in the manner described above.

The semiconductor device 150 of FIGURE 11 is relatively easy to fabricate from a body of n-type semiconductor material. Since the fabrication steps are well known to those skilled in the art, they will be set forth only briefly herein. A p-type doping material is diffused through the top and bottom surface of an n-type body, whereby there is formed a body having a central layer of n-type semiconductivity between a top and bottom layer of p-type semiconductivity. There is a p-n junction between the p- and n-type layers.

The bottom p-type layer comprises p-type region 158. A groove 190 is abraded or etched entirely through the top p-type layer and the central n-type layer, at approximately the midpoint thereof. The groove divides the top p-type layer into a p-type region 154 and 162 and the central n-type layer into n-type regions 156 and 160.

The n-type region 152 is formed on top surface of the p-type region 154 by alloying or vapor diffusion.

The metal layer 159 can be formed on the bottom surface 161 of the p-type region 159 by any suitable method such as soldering, brazing, electrolytic or electroless plating, flame spraying, plasma jet plating and the like.

The p- and n-type doping materials employed are those known to any one skilled in the art and include for exmple p-type doping materials, boron, aluminum, gallium, and indium. Examples of n-type doping materials include phosphorus, arsenic, and antimony.

Figure 12:
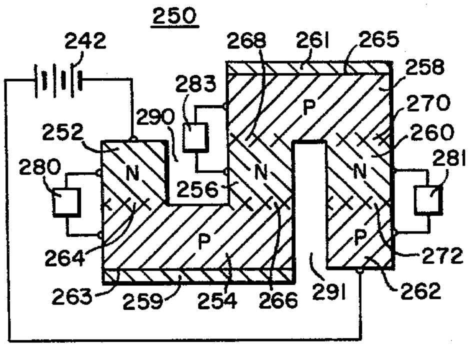
FIGURE 12 is a schematic diagram of a semiconductor device which functions in the same manner as the device set forth in FIGURE 3 but is of different geometric configuration.

With reference to FIGURE 12, there is illustrated another six region semiconductor device 250 which is the functional equivalent of the semiconductor device 50. The semiconductor device 250 is comprised of regions 252, 254, 256, 258, 260 and 262 with p-n junctions 264, 266, 268, 270 and 272 therebetween, which regions and p-n junctions are the functional equivalents of regions, 52, 54, 56, 58, 60 and 62 and p-n junctions 64, 66, 68, 70 and 72 respectively of the semiconductor device 50.

Layers 259 and 261 comprised of an electrically conductive metal are affixed to surface 263 of region 254 and to surface 265 of region 258 respectively. The layers 261 and 259 serve to reflect and reinject carriers back into the regions 254 and 258 respectively. As pointed out hereinabove, the operation of reflective layers is discussed in detail in U.S. patent application Serial No. 859,191. Semiconductor device 250 is comprised of a four region semiconductor structure and a three region semiconductor structure joined through a common region. The four region structure is comprised of regions 252, 254, 256 and 258. The three region structure is comprised of regions 258, 260 and 262. Carriers passing from region 252 to region 262 are reflected by the metal layers 259 and 261.

When a voltage from a direct current power source 242 is impressed entirely across the device 250 from region 252 to 262, semiconductor device 250 will oscillate.

An electrical signal, from a source 280, can be applied between region 252 and 254, the first two regions of the four region structure, and across the p-n junction 264 therebetween, to modulate the amplitude of the wave of oscillation as described hereinabove.

An electrical signal from an electrical source 281 applied between regions 260 and 262, to independent regions of the three region structure, and across the p-n junction 172 therebetween, will modulate the frequency of oscillation wave in the manner described hereinabove.

If an electrical signal from an electrical source 283 is applied between regions 258 and 256, the regions common to both structures and the next consecutive region of the four region structure respectively, and across the p-n junction 268 therebetween, both the amplitude and frequency of oscillation can be modulated in the manner described hereinabove.

The semiconductor device 250 can be readily fabricated from a wafer of n-type semiconductive material by vapor diffusion and by the etching of grooves 290 and 291.

Figure 13:
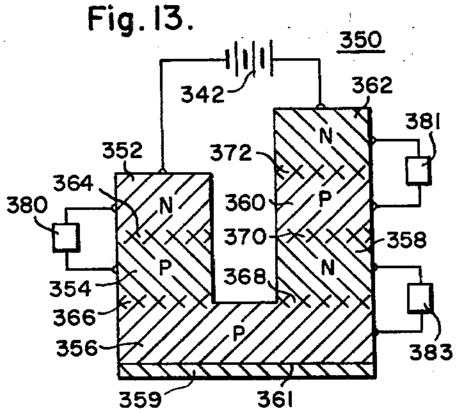
FIGURE 13 is a schematic diagram of a semiconductor device which functions in the same manner as the device set forth in FIGURE 3 but is of different geometric configuration.

With reference to FIGURE 13, there is illustrated a six region semiconductor device 350 which is the functional equivalent of the semiconductor device 50. Semiconductor device 350 is comprised of regions 352, 354, 356, 358, 360 and 362 with p-n junctions 364, 366, 368, 370 and 372 therebetween, which regions and p-n junctions are the functional equivalent of regions 52, 54, 56, 58, 60 and 62 and p-n junction 64, 66, 68, 70 and 72 respectively of the semiconductor device 50.

A metal layer 359 of an electrically conductive metal is affixed to bottom surface 361 of region 356 to effect carrier reflection.

When a direct current voltage from a source 342 is applied across the semiconductor device 350 through regions 352 and 362, the device 350 will oscillate in the same manner as semiconductor device 50 provided that the first quadrant I–V collector voltage current characteristic of the three region structure which is comprised of regions 358, 360, and 362 falls within the first quadrant negative resistance area of the I–V characteristic of the four region structure which is comprised of regions 252, 354, 356 and 358.

An electrical signal, from a source 380, can be applied between regions 352 and 354, the first two regions of the four region structure, and across the p-n junction 364 therebetween, to modulate the amplitude of the wave of oscillation as described hereinabove.

An electrical signal from an electrical source 381 applied between regions 360 and 362, and the two independent regions of the three region structure, and across p-n junction 372 therebetween, modulate the frequency of oscillation in the manner described above.

If an electrical signal from an electrical source 383 is applied between regions 358 and 356, the region, to both structures and the next consecutive region of the four region structure respectively, and across the p-n junction 368 therebetween, both the amplitude and frequency of the oscillation wave can be modulated in the manner described above.

Figure 14:
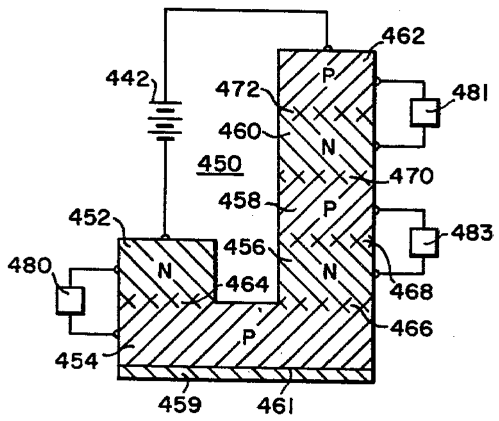
FIGURE 14 is a schematic diagram of a semiconductor device which functions in the same manner as the device set forth in FIGURE 3 but is of different geometric configuration.

With reference to FIGURE 14, there is illustrated a six region semiconductor device 450 which is the functional equivalent of the semiconductor device 50. The semiconductor device 450 is comprised of regions 452, 454, 456, 458, 460 and 462 with p-n junctions 464, 466, 468, 470 and 472 therebetween which regions and p-n junctions are the functional equivalents of regions 52, 54, 56, 58, 60 and 62 and p-n junctions 64, 66, 68, 70 and 72 respectively of the semiconductor device 50. The layer 459 of an electrically conductive metal is affixed to bottom surface 461 of region 454 and serves as a carrier reflector.

When a direct current voltage from a source 442 is applied across the semiconductor device 450 through regions 452 and 462, the device 450 will oscillate in the same manner as semiconductor device 50 provided of course that the first quadrant I–V collector voltage-current characteristic of the three region structure which is comprised of regions 458, 460 and 462 falls within the first quadrant negative resistance area of the I–V characteristic of the four region structure which is comprised of regions 452, 454, 456 and 458.

An electrical signal from the source 480 can be applied between regions 452 and 454, the first two regions of the four region structure and the p-n junction 164 therebetween, to modulate the amplitude of the wave of oscillation as described above.

An electrical signal from an electrical source 481 applied between regions 460 and 462, the two independent regions of the three region structure, and across p-n junction 472 therebetween will modulate the frequency of the oscillation wave in the manner described above.

If an electrical signal from an electrical source 483 is applied between regions 458 and 456, the region common to both structures and the next consecutive region of the four region structure respectively, and across the p-n junction 468 therebetween, both the amplitude and frequency of the oscillatory wave can be modulated in the manner described hereinabove.

Figure 15:
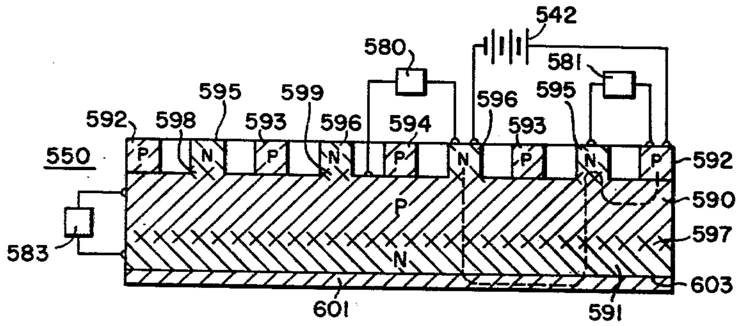
FIGURE 15 is a schematic diagram of a semiconductor device having three layers and six functional regions.

With reference to FIGURE 15, there is illustrated a three layer six functional region semiconductor device.

A layer of a semiconductor material will be understood to comprise the volume of a semiconductive material having opposed faces and being comprised of at least one region. The region is the homogeneous portion of a layer having the same type of semiconductivity.

The semiconductor device 550 is comprised of the central layer, which consists entirely of p-type region 590, a bottom layer which consists entirely of n-type region 591 and a top layer which is comprised of p-type regions 592, 593 and 594, and n-type regions 595 and 596. There is a p-n junction 597 between regions 590 and 591 and a p-n junction 598 between n-type region 595 and p-type region 590 and a p-n junction 599 between n-type region 596 and p-type region 590.

When contact is made between two non-adjacent regions of opposite type semiconductivity, in the top layer, the device 550 will operate as a six region device. Reference should be had to U.S. patent application Serial No. 859,191, filed December 14, 1959, the inventor and assignee of which are the same as that of the present invention, for a detailed explanation of the operation of the device set forth in FIGURE 15.

A metallic carrier reflective layer 601 is affixed to bottom surface 603 of the n-type region 591.

When a direct current voltage from a source 542 is applied across the semiconductor device 550, through the regions 592 and 593, the device 550 will oscillate in the same manner as semiconductor device 50 provided that the first quadrant I–V collector voltage-current characteristic of the three region structure which is comprised of regions 590, 595 and 592 falls within the first quadrant negative resistance area of the I–V characteristic of the four region structure which is comprised of regions 596, 590, 591 and 590 again. It will be noted that within the four region structure, the two p-regions are both comprised of region 590. The path of the carriers through the device 550 is set forth with a broken line to illustrate how the region 590 serves a dual function within the structure.

An electrical signal from the source 580 can be applied between regions 596 and 590, the first two regions of the four region structure, and across the p-n junction 599 therebetween, to modulate the amplitude of the wave of oscillation as described hereinabove for the semiconductor device 50.

An electrical signal from an electrical source 581 applied between regions 595 and 592, the two independent regions of the three region structure, and across p-n junction 598 therebetween, will modulate the frequency of the oscillation wave in the manner described hereinabove relative to the semiconductor device 50.

If an electrical signal from an electrical source 583 is applied between regions 590 and 591, the region common to both structures in the next consecutive region of the four region structure respectively, and across the p-n junction 597 therebetween, both the amplitude and frequency of the oscillation wave can be modulated in the manner described hereinabove relative to the semiconductor device 50.

The fabrication of the device 550 is relatively simple, and obvious to any one skilled in the art. For example, if the fabrication is begun from a body of semiconductor material having a p-type semiconductivity, the n-type region 591 can be formed readily by vapor diffusion. The p-type regions 592, 593 and 594, and the n-type regions 595 and 596 can be readily formed on the upper surface of the p-type region 590 by alloying or vapor diffusion. The metal layer 601 can be affixed to the bottom surface of the region 591 by any of the processes known to those skilled in the art and set forth hereinabove. The following examples are illustrative of the practice of this invention.

*Example I*

The flat circular wafer of single crystal p-type silicon having a doping concentration of from 10 to 13 to 10 to 17 carriers per cubic centimeter of silicon and a resistivity of from 1/10 to 1,000 ohm centimeters, and having a diameter of ½ inch the thickness of 5 mils, coated on its circular edge and top surface with a masking oxide layer. The wafer was then disposed in a diffusion furnace. The diffusion furnace was at a maximum temperature of 1200° C. at a nitrogen atmosphere. Within the diffusion furnace phosphorus was allowed to diffuse into the bottom surface of the wafer to a depth of 1 mil. The wafer was then removed from the diffusion furnace and the masking layer removed from the circular edge and top surface.

Thereafter, a pellet having a diameter of 0.090 inch and comprised of 99%, by weight, of gold and 1%, by weight, boron, and having a thickness of 1 mil, was disposed centrally upon the top surface of the wafer. The foil having an outside diameter of 0.490 inch and an inside diameter of 0.400 inch was disposed around the peripheral edge of the top surface of the wafer. The foil was comprised of 99%, by weight, gold and 1%, by weight, boron. Another foil having an outside diameter of .290 inch, an inside diameter of .200 inch and comprised of 99%, by weight, gold, and 1%, by weight, of boron was disposed on the top surface of the wafer centrally between the centrally disposed pellet and the peripherally disposed foil. Another foil having an outside diameter of .190 inch, an inside diameter of .100 inch and comprised of 99%, by weight, gold and 1%, by weight, arsenic was disposed on the top surface of the wafer substantially centrally between the centrally disposed pellet and the last-mentioned foil. Another foil having an outside diameter of .390 inch, an inside diameter of .300 inch and comprised of 99%, by weight, gold and 1%, by weight, arsenic was disposed substantially centrally between the peripheral foil and the adjacent foil on the top surface of the wafer. The wafer with the pellet and various foils disposed upon the top surface thereof was then heated to a temperature of approximately 700° C. whereby the pellet and the foils were fused to the wafer.

During the fusion operation, the contact layer comprised of 99%, by weight, gold and 1%, by weight, antimony having a thickness of 0.0008 inch and a diameter of ½ inch was simultaneously fused to the bottom surface of the silicon wafer. Only the electrical contacts comprised of tin were then fused to each of the several foils and pellets that had been previously fused to the top surface of the wafer.

The structure thus prepared was that illustrated in FIGURE 15.

A direct current voltage source was connected in series with an oscilloscope and the semiconductor device. The contact was made between the peripheral foil which is p-type, and the foil immediately adjacent to the central pellet, which foil is n-type. Oscillation having a saw tooth wave form was noted on the oscilloscope.

An alternating current power source was connected between the n-type foil immediately adjacent to the central pellet on the top surface of the device and to the central p-type region of the device. The activation of the alternating current electrical signal resulted in modulation of the saw tooth oscillatory wave into a sinusoidal shape wave.

An alternating current electrical signal was connected between the p-type peripheral foil on the top surface of the semiconductor device and the next adjacent n-type foil. The oscilloscope screen disclosed that when the electrical signal was activated the frequency of the oscillatory wave was changed.

An alternating electrical current electrical signal was connected between the central p-type region of the device and the bottom n-type region. When the electrical signal was activated, both the amplitude and frequency of the oscillatory wave was changed.

The various semiconductor devices illustrated in FIGURES 11, 12, 13 and 14 were prepared in accordance with well known semiconductor device fabrication techniques.

When a direct current voltage was impressed entirely across each of the devices, they oscillated in the manner set forth in the specification.

When either an alternating current or direct current electrical signal was applied between various regions and across various junctions of the device in the manner set forth herein, the amplitude, frequency, and the amplitude and frequency both at the same time were modified in accordance with the teachings of this invention.

Semiconductor devices which function in the manner set forth in this invention are useful in the communications field and in the testing of communication and radar and other energy radiating electrical equipment.

From the above description example and illustration, it is obvious that the objects of this invention set forth hereinabove have been achieved.

The various fabrication steps set forth in this specification for preparing the devices of this invention are well known to those skilled in the art and it is not believed that a detailed explanation of the preparation of each of the devices is necessary to the understanding of this invention.

While the invention has been described with reference to particular embodiments and examples, it will be understood that modifications, substitutions and the like may be made therein without departing from its scope.

I claim as my invention:

1. An oscillatory semiconductor device comprising a unitary body of a semiconductor material having six functional regions of alternate n- and p-type semiconductivity with p-n junctions therebetween, four of said functional regions functioning as a four region negative resistance semiconductor device, and three of said functional regions functioning as a three region semiconductor device, said four region semiconductor device exhibiting a negative resistance region in the first quadrant of its I–V characteristic, and the first quadrant I–V characteristic of the three region device falling entirely within the negative resistance region of the four region device characteristic, means for applying a voltage across the entire device whereby oscillation is initiated, and means for modulating said oscillation by the application of a signal across one of the junctions between two of the regions within the device.

2. An oscillatory semiconductor device comprising a unitary body of a semiconductor material having at least six regions of alternate n- and p-type semiconductivity with p-n junctions therebetween, four of the said regions being consecutive and in contact with each other whereby they function as a four region negative resistance semiconductor structure, means for applying a direct current voltage across the entire semiconductor device whereby oscillation is initiated, and means for modulating the amplitude of the oscillation wave by the application of a signal across the junction between the first two regions of the four region semiconductor structure.

3. An oscillatory semiconductor device comprising a unitary body of a semiconductor material having six regions of alternate n- and p-type semiconductivity with p-n junctions therebetween, said six regions serving functionally as a four region negative resistance semiconductor structure and a three region semiconductor structure, the two structures having a common region and three consecutive independent regions and two consecutive independent regions respectively, means for applying a voltage across the entire device whereby oscillation is initiated, and means for modulating the frequency of the oscillation by the application of an electrical signal across the two independent regions of the three region structure.

4. An oscillatory semiconductor device comprising a unitary body of a semiconductor material having six functional regions of alternate n- and p-type semiconductivity with p-n junctions therebetween, said six functional regions serving functionally as a four region negative resistance structure and a three region structure, the two structures having a common region and three consecutive independent regions and two consecutive independent regions respectively, means for applying a voltage across the entire device whereby oscillation is initiated, and means for modulating the amplitude and frequency of the oscillation by the application of a signal across the common region and the next consecutive region of the four region structure.

5. An oscillatory semiconductor device comprising a unitary body of a semiconductor material having six functional regions of alternate n- and p-type semiconductivity with p-n junctions therebetween, said six regions serving functionally as a four region structure and a three region structure, the two structures having a common region and three consecutive independent and two consecutive independent regions respectively, the four region structure having a negative resistance area within the first quadrant of its I–V characteristic, and the first quadrant I–V characteristic of the three region structure falling entirely within negative resistance area of the four region structure, means for applying a voltage across the entire device whereby oscillation is initiated, and means for modulating said oscillation by the application of a signal across one of the junctions between the regions within the device.

6. An oscillatory semiconductor device comprising a unitary body of a semiconductor material having six functional regions of alternate n- and p-type semiconductivity with p-n junctions therebetween, said six regions serving functionally as a four region structure and a three region structure, the two structures having a common region and three consecutive independent regions and two consecutive independent regions respectively, the four region structure having a negative resistance area within the first quadrant of its I–V characteristic, and the first quadrant I–V characteristic of the three region structure falling entirely within the negative resistance area of the four region structure, means for applying a voltage across the entire device whereby oscillation is initiated, and means for modulating the amplitude of the oscillation by the application of a signal across the junction between the first two consecutive independent regions of the four region device, whereby the breakover voltage of the four region structure is changed.

7. An oscillatory semiconductor device comprising a unitary body of a semiconductor material having six functional regions of alternate n- and p-type semiconductivity with p-n junctions therebetween, said six regions serving functionally as a four region structure and a three region structure, the two structures having a common region and three consecutive independent regions and two consecutive independent regions respectively, the four region structure having a negative resistance area within the first quadrant of its I–V characteristic, and the first quadrant I–V characteristic of the three region structure falling entirely within the negative resistance area of the four region structure, means for applying a voltage across the entire device whereby oscillation is initiated, and means for modulating the frequency of the oscillation by the application of a signal across the two independent regions of the three region structure, the first quadrant I–V characteristic of the three region structure still being maintained entirely within the negative resistance area of the first quadrant I–V characteristic of the four region structure.

8. An oscillatory semiconductor device comprising a unitary body of a semiconductor material having six functional regions of alternate n- and p-type semiconductivity with p-n junctions therebetween, said six regions serving functionally as a four region structure and a three region structure, the two structures having a common region and three consecutive independent regions and two consecutive independent regions respectively, the four region structure having a negative resistance area within the first quadrant of its I–V characteristic, and the first quadrant I–V characteristic of the three region structure falling entirely within the negative resistance area of the four region structure, means for applying a voltage across the entire device whereby oscillation is initiated, and means for modulating the amplitude and frequency of the oscillation by the application of a signal across the common region and the next consecutive region of the four region device, whereby the breakover voltage of the four region structure is changed, and the first quadrant I–V characteristic of the three region structure is still maintained entirely within the negative resistance region of the first quadrant I–V characteristic of the four region structure.

9. A modulated oscillator comprising a semiconductor structure having four functional regions of alternate n- and p-type semiconductivity with p-n junctions therebetween, a semiconductor structure having three functional regions of alternate n- and p-type semiconductivity with p-n junctions therebetween, a direct current power source, means for connecting the four region structure, the three region structure and the power source in a series circuit relationship whereby the semiconductor structure will oscillate, and means for modulating said oscillation by the application of a signal across a p-n junction in at least one of the semiconductor devices.

10. A modulated oscillator comprising a semiconductor structure having four functional regions of alternate n- and p-type semiconductivity with p-n junctions therebetween, a semiconductor structure having three functional regions of alternate n- and p-type semiconductivity with p-n junctions therebetween, a direct current power source, and means for connecting the four region structure, the three region structure and the power source in a series circuit relationship with a load, whereby the semiconductor structure will oscillate, and means for modulating said oscillation by the application of an electrical signal across a p-n junction in at least one of the semiconductor structures.

11. A modulated oscillator comprising a semiconductor device, said device comprising a semiconductor structure having four functional regions of alternate n- and p-type semiconductivity with p-n junctions therebetween, and a semiconductor structure having three functional regions of alternate n- and p-type semiconductivity with p-n junctions therebetween, said four functional region structure and said three functional region structure being connected electrically in a series circuit relationship through a common region, means for connecting the semiconductor device in a series relationship with a direct current power source, whereby said semiconductor device will oscillate, and means for modulating said oscillation by applying a signal across a p-n junction within the semiconductor device.

12. A modulated oscillator comprising a semiconductor device, said device comprising a semiconductor structure having four functional regions of alternate n- and p-type semiconductivity with p-n junctions therebetween, and a semiconductor structure having three functional regions of alternate n- and p-type semiconductivity with p-n junctions therebetween, said four functional region structure and said three functional region structure being connected electrically in a series circuit relationship through a common region, the four functional region structure having a negative resistance area within the first quadrant of its I–V characteristic and the first quadrant I–V characteristic of the three functional region structure falling entirely within the negative resistance region of the four functional region structure, means for connecting the semiconductor device in a series relationship with a direct current power source, whereby said semiconductor device will oscillate, and means for modulating said oscillation by applying a signal across the p-n junction within the semiconductor device.

13. A modulated oscillator comprising a semiconductor device, said device comprising a semiconductor structure having four functional regions of alternate n- and p-type semiconductivity with p-n junctions therebetween, and a semiconductor structure having three functional regions of alternate n- and p-type semiconductivity with p-n junctions therebetween, said four region structure and said three functional region structure being connected electrically in a series circuit relationship through a common region and a floating junction, the four functional region structure having a negative resistance area within the first quadrant of its I–V characteristic, and the first quadrant I–V characteristic of the three functional region structure falling entirely within the negative resistance area of the four functional region structure, means for connecting the semiconductor device in a series relationship with a direct current power source, whereby said semiconductor device will oscillate, and means for modulating said oscillation by applying a signal across a p-n junction within the semiconductor device.

14. A modulated oscillator comprising a semiconductor device, said device comprising a semiconductor structure having four functional regions of alternate n- and p-type semiconductivity with p-n junctions therebetween, and a semiconductor structure having three functional regions of alternate n- and p-type semiconductivity with p-n junctions therebetween, said four functional region structure and said three functional region structure being connected electrically in a series circuit relationship through a common region and a floating junction, the four functional region structure having a negative resistance area within the first quadrant of its I–V characteristic, and the first quadrant I–V characteristic of the three functional region structure falling entirely within the negative resistance area of the four functional region structure, means for connecting the semiconductor device in a series relationship with a direct current power source, whereby said semiconductor device will oscillate, and means for modulating the amplitude and frequency by applying a signal across the common region and the next consecutive region of the four functional region structure.

15. A modulated oscillator comprising a semiconductor device, said device comprising a semiconductor structure having four functional regions of alternate n- and p-type semiconductivity with p-n junctions therebetween, and a semiconductor structure having three functional regions of alternate n- and p-type semiconductivity with p-n junctions therebetween, said four functional region structure and said three functional region structure being connected electrically in a series circuit relationship through a common region and a floating junction, the four functional region structure having a negative resistance area within the first quadrant of its I–V characteristic, and the first quadrant I–V characteristic of the three functional region structure falling entirely within the negative resistance area of the four functional region structure, means for connecting the semiconductor device in a series relationship with a direct current power source, whereby said semiconductor will oscillate, and means for modulating the frequency of oscillation by applying a signal across the two independent regions of the three region structure.

16. A modulated oscillator comprising a semiconductor device, said device comprising a semiconductor structure having four functional regions of alternate n- and p-type semiconductivity with p-n junctions therebetween, and a semiconductor structure having three functional regions of alternate n- and p-type semiconductivity with p-n junctions therebetween, said four functional region structure and said three functional region structure being connected electrically in a series circuit relationship through a common region and a floating junction, the four functional region structure having a negative resistance area within the first quadrant of its I–V characteristic, and the first quadrant I–V characteristic of the three functional region structure falling entirely within the negative resistance area of the four functional region structure, means for connecting the semiconductor device in a series relationship with a direct current power source, whereby said semiconductor will oscillate, and means for modulating the amplitude of oscillation by applying a signal across the two regions of the four region structure.

References Cited in the file of this patent

UNITED STATES PATENTS

| | | |
|---|---|---|
| 2,805,397 | Ross | Sept. 3, 1957 |
| 2,820,154 | Kurshan | Jan. 14, 1958 |
| 2,838,617 | Tummer et al. | June 10, 1958 |
| 2,936,384 | White | May 10, 1960 |
| 2,984,752 | Giacolette | May 16, 1961 |